United States Patent
Starner

(10) Patent No.: US 6,901,317 B2
(45) Date of Patent: May 31, 2005

(54) INERTIAL TEMPERATURE CONTROL SYSTEM AND METHOD

(75) Inventor: Alan L. Starner, Orange, CA (US)

(73) Assignee: Aviza Technology, Inc., Scotts Valley, CA (US)

( * ) Notice: Subject to any disclaimer, the term of this patent is extended or adjusted under 35 U.S.C. 154(b) by 98 days.

(21) Appl. No.: 10/068,127

(22) Filed: Feb. 6, 2002

(65) Prior Publication Data

US 2002/0143426 A1 Oct. 3, 2002

Related U.S. Application Data

(60) Provisional application No. 60/266,926, filed on Feb. 6, 2001.

(51) Int. Cl.[7] .............................................. G06F 19/00
(52) U.S. Cl. ....................................... 700/299; 700/121
(58) Field of Search ............................... 700/299, 121; 219/494, 497

(56) References Cited

U.S. PATENT DOCUMENTS

| | | | | |
|---|---|---|---|---|
| 4,669,040 A | * | 5/1987 | Pettit et al. ................... 700/42 |
| 4,782,215 A | * | 11/1988 | Kadwell et al. ............ 219/494 |
| 4,807,144 A | | 2/1989 | Joehlin et al. |
| 4,842,686 A | * | 6/1989 | Davis et al. ................. 438/709 |
| 4,845,332 A | | 7/1989 | Jancosek et al. |
| 4,952,227 A | | 8/1990 | Herrington et al. |
| 5,561,612 A | * | 10/1996 | Thakur ....................... 700/300 |
| 5,618,351 A | | 4/1997 | Koble, Jr. et al. |
| 5,963,840 A | * | 10/1999 | Xia et al. .................... 438/783 |
| 5,994,675 A | | 11/1999 | Bethune et al. |
| 6,005,225 A | | 12/1999 | Kowalski et al. |
| 6,059,567 A | | 5/2000 | Bolton et al. |
| 6,133,550 A | | 10/2000 | Griffiths et al. |
| 6,207,937 B1 | * | 3/2001 | Stoddard et al. ............ 219/497 |
| 6,222,164 B1 | | 4/2001 | Stoddard et al. |
| 6,273,604 B1 | | 8/2001 | Hemmerich et al. |
| 6,449,534 B1 | * | 9/2002 | Stewart ....................... 700/299 |

FOREIGN PATENT DOCUMENTS

WO    WO 99/59196 A1    11/1999

\* cited by examiner

*Primary Examiner*—Leo Picard
*Assistant Examiner*—Michael D. Masinick
(74) *Attorney, Agent, or Firm*—Dorsey & Whitney LLP

(57) ABSTRACT

An inertial temperature control system and method are provided for changing the temperature of a body between two temperatures such that the ending temperature is reached smoothly without substantial temperature overshoot or oscillation. A temperature control algorithm is fed a set point temperature that accelerates and decelerates at a physically attainable rate.

26 Claims, 8 Drawing Sheets

INERTIAL TEMPERATURE CONTROL SYSTEM AND METHOD

CROSS REFERENCE TO RELATED APPLICATION

This application claims the benefit of provisional application Ser. No. 60/266,926, filed Feb. 6, 2001, the disclosure of which is hereby incorporated by reference in its entirety.

FIELD OF THE INVENTION

This invention relates to a temperature control system and method used to change from one setpoint temperature to another. More specifically, the present invention relates to an inertial temperature control system and method used in a manufacturing process, such as but not limited to, semiconductor manufacturing processes and equipment.

BACKGROUND OF THE INVENTION

Temperature control systems and methods play a vital role in many manufacturing processes. Current state of the art methods of controlling temperature in manufacturing process employ temperature control algorithms such as Proportional, Integral, Derivative (PID) algorithms or fuzzy logic. The PID algorithm is well known in control theory, and uses the difference between the current measured temperature and the desired temperature (the error value) to determine the amount of power to apply to a heating circuit. As the name suggests, there are three terms in the PID calculation. The proportional term provides a contribution to the power proportional to the error value. The integral term provides a contribution to the power proportional to the integral (sum) of the error value over time. The derivative term provides a contribution to the power proportional to the differential (rate of change of) the error value.

When changing the desired temperature, the PID algorithm responds to the changing set point (desired temperature) by increasing the power (if ramping up to a higher set point) or decreasing the power (if ramping down to a lower set point). Typically when ramping to a higher temperature, the measured temperature will lag behind the set point, and then over shoot the desired temperature and oscillate before settling in to match it. This is depicted in FIG. 1.

Of additional importance is limiting the ramp rate to protect against negative thermal effects on the object or objects being heated due to excessive internal temperature gradients within the object. This is of particular concern in semiconductor wafer processing systems. Excessive heating of the edge of a wafer relative to its center can result in physical and/or chemical damage that could render the wafer unuseable or lead to early failure of semiconductor chips manufactured from the wafer.

When heating or cooling from one temperature to another within a semiconductor wafer processing system, such as a furnace, it is important to stabilize at the desired setpoint temperature in a minimum amount of time. Classically, a furnace will use a controlled linear ramp to go from one temperature setpoint to another. Although this provides continuous setpoint temperature values, the resulting ramp rate is not continuous as shown in FIG. 1. Rather, the ramp rate jumps from 0 to some value (the ramp rate), and then back to zero when the final setpoint is reached. The second derivative of the setpoint is the temperature acceleration, which must be infinite in order to instantaneously jump from 0 ramp rate to a non-zero value and back again. Real objects are incapable of the instantaneous and infinite "acceleration" in temperature ramp rate that is necessary to heat or cool under this idealized regimen. The result is a time delay after the start of heating before the object's actual temperature ramp rate achieves the desired ramp rate. A similar effect of "heating inertia" occurs as the temperature of the object approaches the final setpoint. When the furnace shuts off, the temperature ramp "deceleration rate" must be negative infinity to bring the ramp rate from a non-zero value back to zero. As a result, the object's temperature overshoots the setpoint and then oscillates above and below it before finally settling down to a stable temperature as depicted in FIG. 1.

The time delay or lag in the beginning of the ramp phase, overshooting of the desired setpoint, and temperature oscillations about the setpoint that are associated with prior art control methods as shown in FIG. 1 are undesirable in many applications when stable and precise temperature control is required. Accordingly an improved system and method of temperature control is needed.

SUMMARY OF THE INVENTION

Accordingly, it is an object of the present invention to provide an improved system and method of temperature control. More particularly the present invention provides an improved system and method of temperature control in a manufacturing process, such as but not limited to semiconductor processing and equipment. Specifically, the present invention provides a system and method of controlling temperature using inertial temperature control and a temperature control algorithm such as those used in commercially available PID controllers or in other devices based on fuzzy logic. The present invention controls acceleration and deceleration of the temperature ramp rate set point so that temperature changes in a body occur at a finite and physically obtainable rate. This method is applicable to a variety of systems requiring precise control of a variable temperature set point, such as, for example semiconductor processing furnaces. In one illustrative embodiment, the system and method of the present invention is carried out in a multi-zone furnace used in semiconductor processing.

In one embodiment of the present invention a method is provided for changing the temperature of a body housed in a heating chamber in a temperature controlled furnace from a starting to an ending temperature using a temperature control algorithm. One or more controllable heating elements and one or more temperature sensing devices are housed within the furnace's heating chamber. A varying temperature set point is provided to the temperature control algorithm. This set point temperature accelerates from the starting temperature toward an ending temperature at a finite rate until the temperature ramp rate reaches a defined maximum ramp rate. The maximum ramp rate is substantially maintained until the set point temperature approaches the ending temperature. Then the set point temperature decelerates from the maximum ramp rate at a finite rate to reach the ending temperature. The temperature control algorithm substantially maintains the temperature of the body in conformance with the provided set point temperatures.

An additional embodiment of the present invention provides a method of changing the temperature of a body housed in a heating chamber in a temperature controlled furnace from a starting to an ending temperature using a temperature control algorithm that includes the following steps. Temperature data from one or more temperature sensing devices placed in the heating chamber and a temperature set point are provided as inputs to the temperature control algorithm. The temperature control algorithm controls power delivery to one or more controllable heating elements in the furnace. The temperature set point accelerates from the starting set point temperature at a finite programmed acceleration rate until a defined maximum temperature ramp rate is achieved. Then, the set point temperature is maintained at the maximum temperature ramp rate until the ending temperature is approached. Finally, the temperature set point is decelerated from the maximum ramp rate at a finite programmed deceleration rate until the ending set point temperature is reached. This deceleration is carried out in a manner that causes the temperature of the body to reach the ending set point temperature smoothly without substantially overshooting or oscillating about the ending set point temperature.

Another embodiment of the current invention provides a temperature controlled furnace for changing the temperature of a body. The furnace includes a heating chamber housing one or more controllable heating elements and one or more temperature sensing devices. Power delivery to the heating elements is controlled by a temperature controller configured to receive a set point temperature profile and temperature data inputs representative of temperature sensing devices housed in the heating chamber. The temperature controller provides heating power commands to ramp the temperature of the body through a temperature acceleration phase, a constant ramp rate phase, and a temperature deceleration phase to achieve a desired temperature substantially smoothly with minimal oscillation around the desired temperature.

BRIEF DESCRIPTION OF THE DRAWINGS

Other objects and advantages of the present invention will become apparent upon reading the detailed description of the invention and the appended claims provided below, and upon reference to the drawings, in which:

DETAILED DESCRIPTION OF THE INVENTION

The ideas involved in inertial temperature control of the present invention have to do with how the temperature set point is managed. In prior art temperature control methods used in the semiconductor industry, an object or a body, such as a semiconductor wafer, is typically temperature ramped in a linear fashion. The actual temperature of the body cannot match the linear ramp rate, so it lags at the start, and overshoots at the end. In contrast, the present invention provides a temperature set point vs. time curve that more closely matches the curve that a real object is capable of following. Thus, the present invention accounts for the "inertial" nature of temperature changes, and controls the set point to allow the actual temperature of a body to follow the set point more closely and thereby minimize overshoot while achieving temperature stability more rapidly than prior art straight linear ramp methods.

Figure 1:
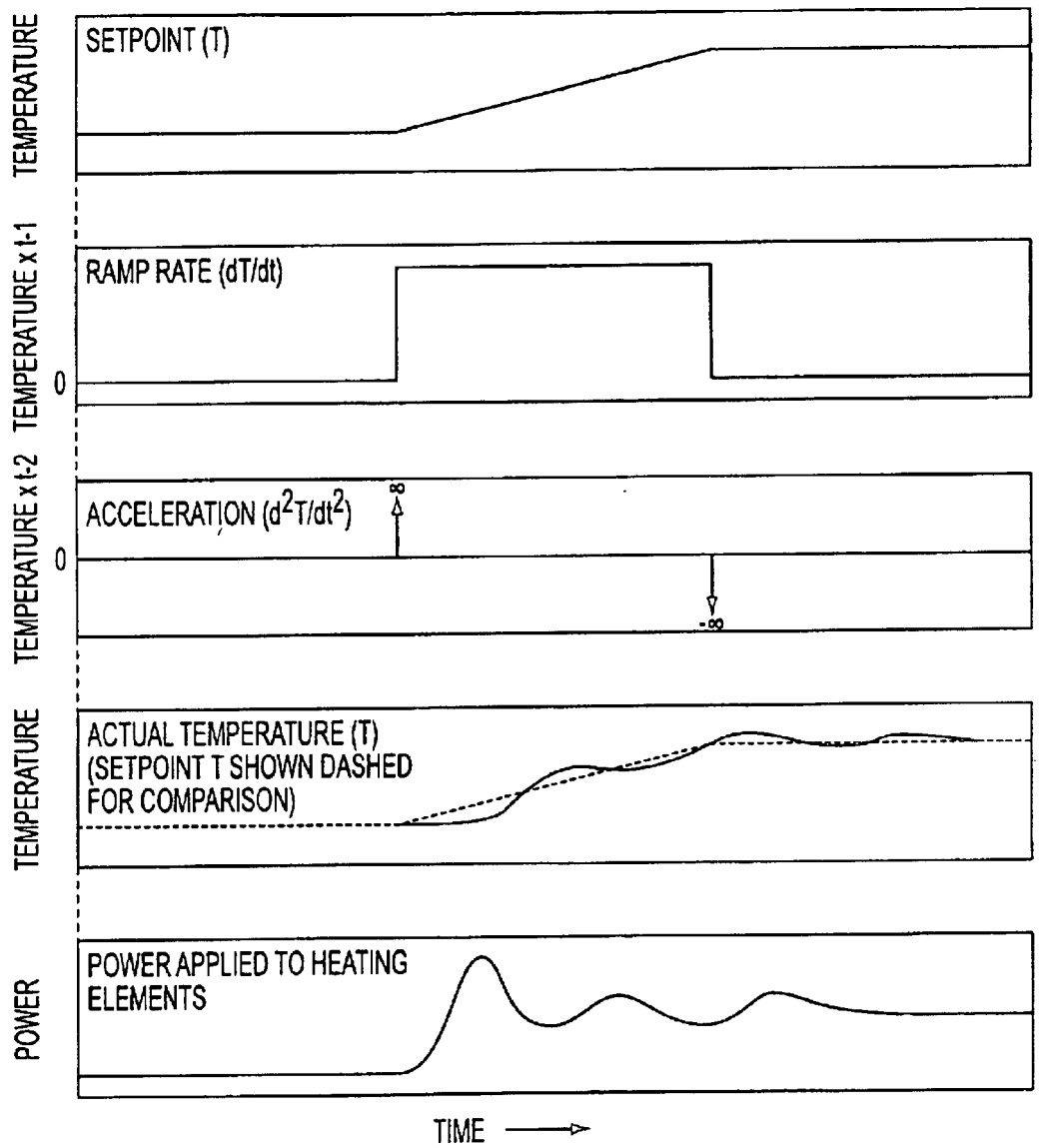
FIG. 1 is a diagram illustrating the temperature control response of prior art temperature control methods.

Heat applied to a body does not instantaneously transfer to that body. There are delays associated with conduction, convection and radiation of heat transfer. The problem with prior art temperature control methods mentioned above lies not in the control algorithm itself, but rather with the assumption that temperature changes can be instantly started or stopped. Temperature changes cannot be accelerated in a instantaneous fashion to a given ramp rate, or instantaneously stopped when the temperature reaches the desired final temperature, as graphically depicted in the prior art method illustrated in FIG. 1. This problem can also be illustrated by analogy to Newtonian physics. An object at rest cannot be instantaneously accelerated to a non-zero velocity. Instead, a gradual acceleration up to a maximum velocity must occur. When the body returns to rest, the process occurs in reverse through gradual deceleration. In the problem addressed by the current invention, temperature is analogous to position, the ramp rate (first time derivative of temperature) is analogous to the velocity, and the rate of increase in the ramp rate (second time derivative of temperature) is the acceleration or deceleration.

Figure 2:
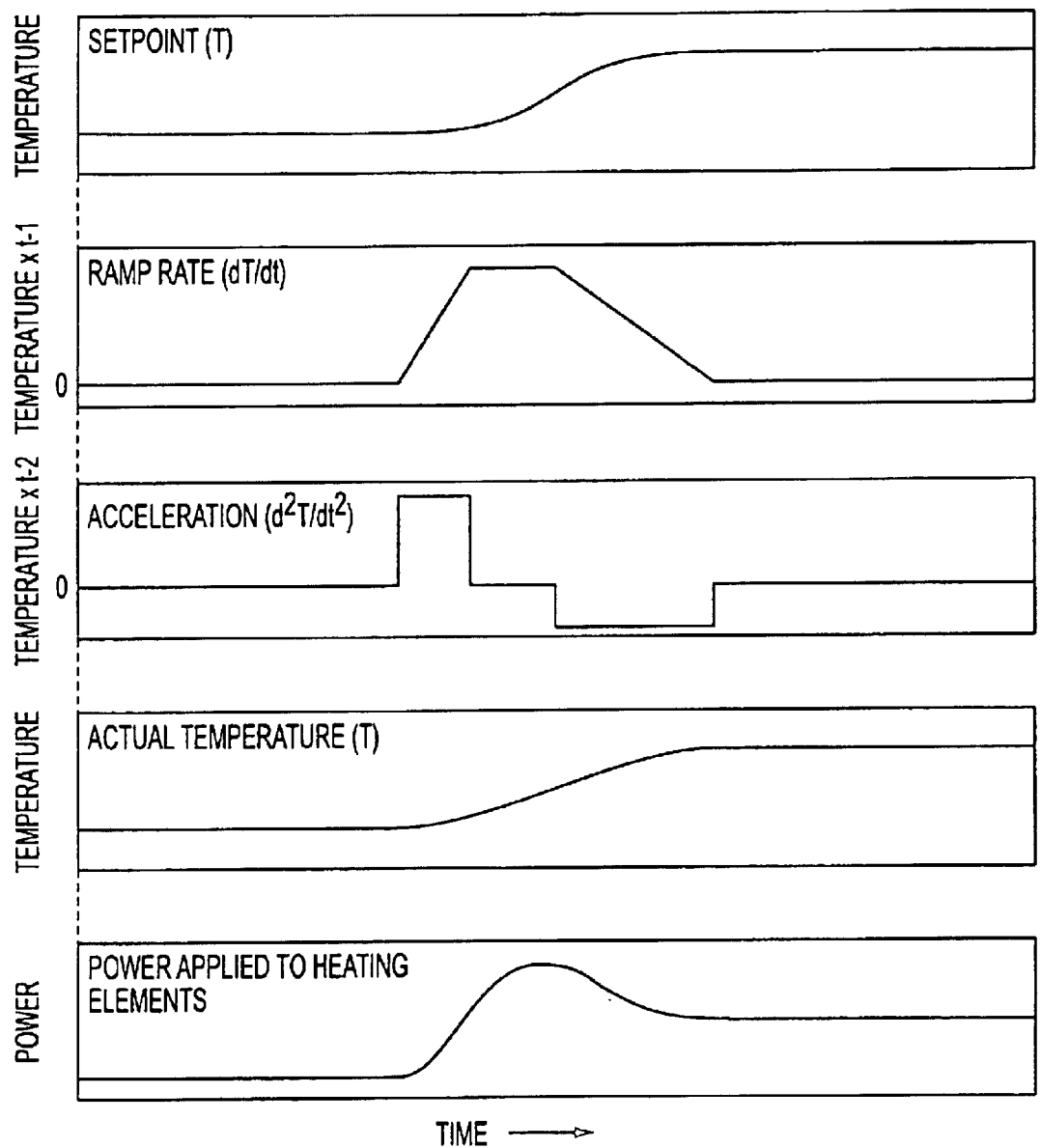
FIG. 2 is a diagram illustrating the temperature control response of the method and system of the present invention.

Changing the set point linearly from one temperature to another requires infinite acceleration or infinite deceleration of the body. Since the body cannot match this commanded input, the result is an early lag in the body's temperature relative to the ideal assumption followed by an overshot as the body temperature exceeds the programmed setpoint at the end of the ramp and then oscillates about the setpoint before finally stabilizing at the programmed temperature. To better control the temperature, the present invention provides control inputs (set points) that change in a way that is physically achievable for the body. The temperature is accelerated up to a given ramp rate, held at that ramp rate until the setpoint temperature is approached, and then decelerated to a zero ramp rate as the body achieves the desired steady state setpoint temperature. As illustrated in FIG. 2, modified control inputs are provided so that the acceleration commanded by the temperature control algorithm is finite and physically attainable by the body being heated. By providing set points that can be followed by the body being heated, the present invention minimizes or, ideally, eliminates the overshoot and oscillation problems of prior art methods.

Figure 3:
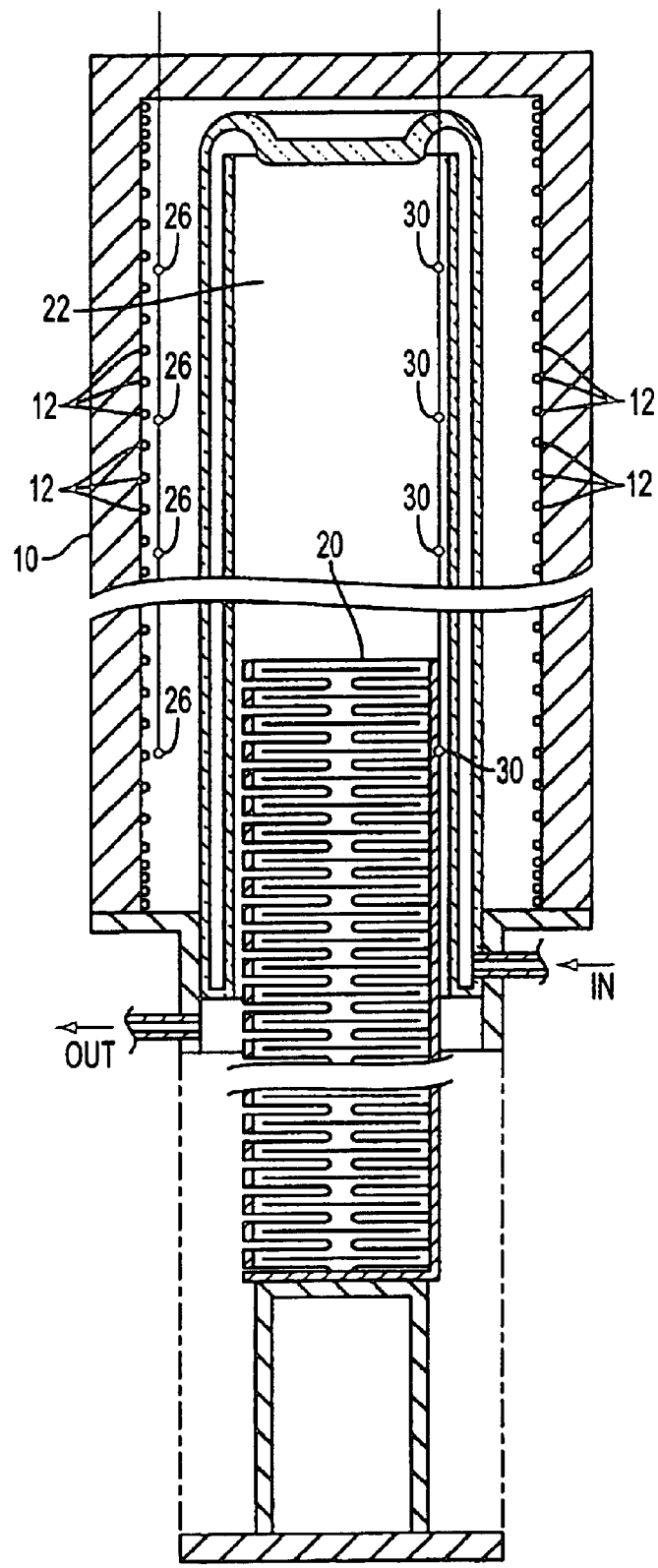
FIG. 3 depicts a furnace used in semiconductor manufacturing which may employ the system and method of the present invention. The furnace includes thermocouples to measure the temperature, and electric heating elements to provide power. In this exemplary embodiment there are 5 zones of control, with two thermocouples in each zone for measurement.
Figure 4:
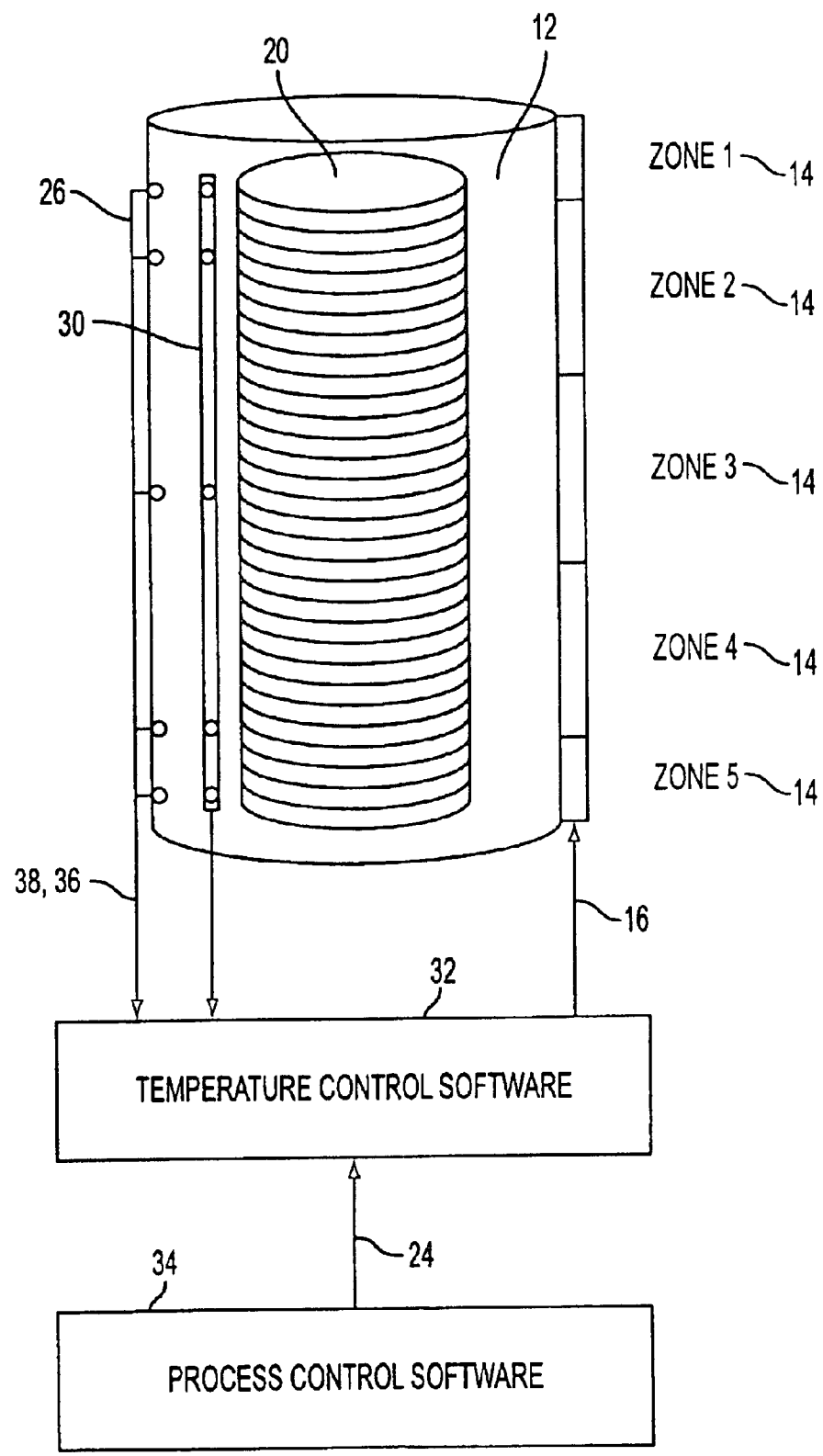
FIG. 4 is a schematic diagram of a furnace showing only the control elements and system employed by the method of the present invention.
Figure 5:
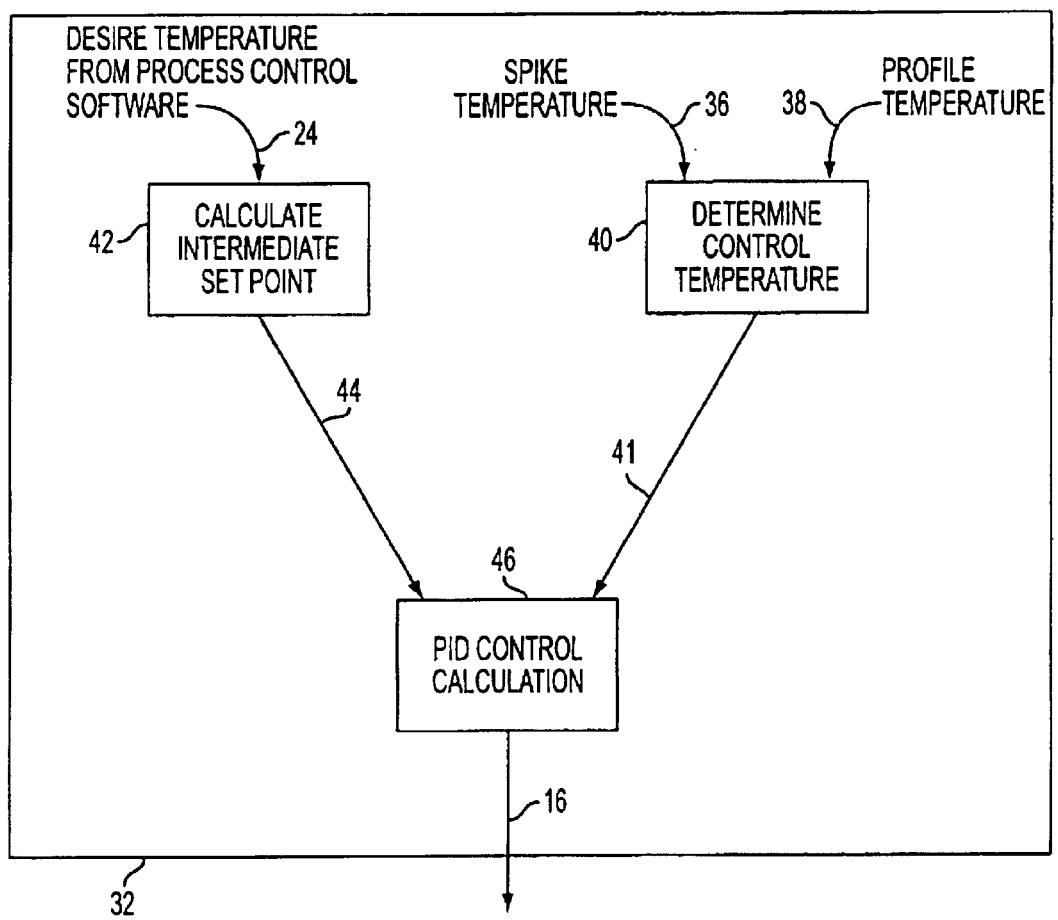
FIG. 5 is a flow chart showing the internal structure of temperature control software in accordance with one embodiment of the system and method of the present invention.

The invention is further illustrated in FIGS. 3, 4, and 5. In one embodiment of the present invention, the method may be used in a semiconductor furnace, such as but not limited to a vertical rapid heating furnace of the type illustrated in FIG. 3. In this embodiment, the furnace includes controllable heater elements 12 which may be separated into individually controllable zones 14. The controllable heating elements 12 may be resistive heating coils, radiant heat lamps, or some other controllable mechanism or system for transferring heat to or from the body. The simplified example of a control system illustrated in FIG. 4 includes five such zones 14. A power command or signal 16 is individually controlled in each zone 14. The purpose of the heater elements 12 is to heat the body 20—in this example silicon wafers—placed inside the heating chamber 22 of the furnace 10 to a desired temperature 24. While a specific semiconductor furnace having five zones 14 is shown, it will be understood by those of skill in the art that the system and method of the present invention can be employed in other types of semiconductor furnaces, and further can be carried out in other types of semiconductor equipment as well as in other applications requiring precise temperature control. The invention is not limited to the specific examples shown. For example, the invention may be used in a furnace with a different number of zones, or a single wafer tool with one or more zones. It may also be used in other heating applications besides those described herein. Inertial temperature is also suitable to control a cooling loop, in addition to a heating loop.

Referring again to the exemplary embodiment, in FIGS. 3 and 4, the control system is shown, generally comprised of a process controller 34 having process control software operationally coupled to a temperature controller 32 having temperature control software. One or more temperature sensing devices are provided. In the illustrative embodiment, these are preferably two sets of thermocouples comprised of one or more spike thermocouples 26 and one or more profile thermocouples 30 provided for temperature measurement inside the heating chamber 22. The spike thermocouples 26 are positioned adjacent to the heating elements 12, and thus respond faster to changes in temperature in the heating chamber 22 in response to temperature control inputs. The profile thermocouples 30 are closer to the body 20—silicon wafers in this illustrative example—and thus better represent its temperature. Temperature controller 32 which is programmed with commercially available temperature control software receives the desired temperature 24 set point from process controller 34 and reads the measured spike temperatures 36 and profile temperatures 38 from the respective thermocouples 26, 30. Temperature set points as a function of time may preferably be programmed into the process control software as a set point temperature profile. Based on the control algorithm (described below), the temperature controller software 32 determines the amount of power to apply to each zone 14 of the furnace heater elements 12.

FIG. 5 is a flow chart showing the internal control software of the temperature controller 32 according to one embodiment of the present invention. In the determine control temperature function 40, a single control temperature 41 is calculated based on spike and profile temperatures 36, 38 from the respective thermocouples 26, 30. In this exemplary embodiment of the present invention, these values are combined at a specified ratio, and may also contain offsets to better reflect the actual temperature of the wafers. The ratios can be used to respond to different temperature ranges. The spike thermocouples 26 respond quickly to power inputs, since they are positioned immediately adjacent to the heating elements 12. The profile thermocouples 30 are closer to the body 22, and thus respond more slowly. If furnace control is based only on the profile thermocouple 30, then the slow speed of the body's 22 response can result in oscillations. By specifying a ratio, the response and the accuracy are optimized. The best ratio for a given range of furnace, zone, and temperature conditions is determined empirically as may be readily done by one of ordinary skill in the art, but generally will depend more strongly on profile temperatures 38 at higher temperatures at which the heat transfer from the coils to the thermocouples 26, 30 is faster. In one illustrative embodiment of the current invention performed in a 300 mm atmospheric pressure rapid vertical processor (RVP) furnace with 5 zones and electric coils, the ratio of profile temperature to spike temperature used to calculate the control temperature varies from 50% profile +50% spike at 400° C. to 60% profile +40% spike at 600° C. to 90% profile/10% spike at 700° C. to 100% profile at and above 800° Other ratios may be employed depending on the composition of the body being heated and the parameters of the furnace being used.

The calculate set point function 42 calculates the intermediate temperature set point. This function takes as its input the desired set point temperature 24. It will also maintain its current set point 44. When the current set point 44 is equal to the desired set point temperature 24, then no processing is done and the current set point is passed on to the temperature control algorithm 46. Set point 44 is variable and is referred to herein in a variety of ways such as current set point temperature or intermediate set point temperature. When the calculate set point function 42 receives a desired set point temperature 24 that differs from the current control temperature 41, it accelerates the current set point 44 toward the desired set point temperature 24 at a predetermined acceleration rate. The calculate set point function 42 also maintains the predetermined temperature acceleration rate. When the temperature ramp rate reaches the maximum ramp rate, it maintains the ramp rate at the maximum ramp rate until the temperature approaches the ending set point. When the intermediate temperature setpoint 44 is close enough to the ending set point so that decelerating at the deceleration rate will cause the intermediate set point to reach it, then the ramp rate is reduced to allow this to happen. The maximum ramp rate is preferably in the range of approximately 2° C. min$^{-1}$ to 30° C. min$^{-1}$. The exact value chosen depends on a number of factors including the operating temperature of the furnace and whether heating or cooling is occurring. For heating processes, a temperature ramp rate in the range of approximately 2° C. min$^{-1}$ to 10° C. min$^{-1}$ is preferred. Lower maximum ramp rates are employed at high temperature to minimize the risks of thermal expansion damage to the body being heated. For cooling processes, the maximum ramp rate is often constrained by physical factors other than the power of the furnace. For this reason, the maximum ramp rate for cooling is typically less than approximately 3° C. min$^{-1}$.

The acceleration rate, deceleration rate, and maximum ramp rate are predetermined values that are established for a given furnace. The predetermined values are based on empirically measuring the capabilities of the element. Different types of elements exhibit different capabilities. The acceleration and deceleration rates are based on how fast the thermocouples can respond to the power input which is in turn related to the amount of heat energy the element can supply. Elements with a higher watt density will be capable of greater set point acceleration. Preferably, the acceleration rate will be in the range of approximately 2° C. min$^{-2}$ to 40° C. min$^{-2}$. More preferably, the acceleration rate will be in the range of approximately 4° C. min$^{-2}$ to 15° C. min$^{-2}$. In the RVP furnace described above, an acceleration rate of approximately 8° C. min$^{-2}$ is most preferably used. Similarly, elements with little insulation that can cool quickly will be capable of greater set point deceleration. Temperature deceleration rates in the range of approximately 1° C. min$^{-2}$ to 6° C. min$^{-2}$ and most preferably approximately 2° C. min$^{-2}$ are used.

In one embodiment, the offsets are established using sensarray wafers. These are test wafers with thermocouples attached to them. Specifically, the wafers are held at a given furnace temperature for some period of time, and the difference between the profile and wafer temperatures is measured. Once this static offset is known, the sensarray wafers are removed from the furnace chamber 22. Unsensored wafers are then processed by setting the profile temperature to the desired wafer temperature minus the offset, thus accurately and precisely controlling to the estimated wafer temperature. The PID algorithm function 46 will determine the commanded power 16, based on the control temperature 41 and the set point 44.

Figure 6:
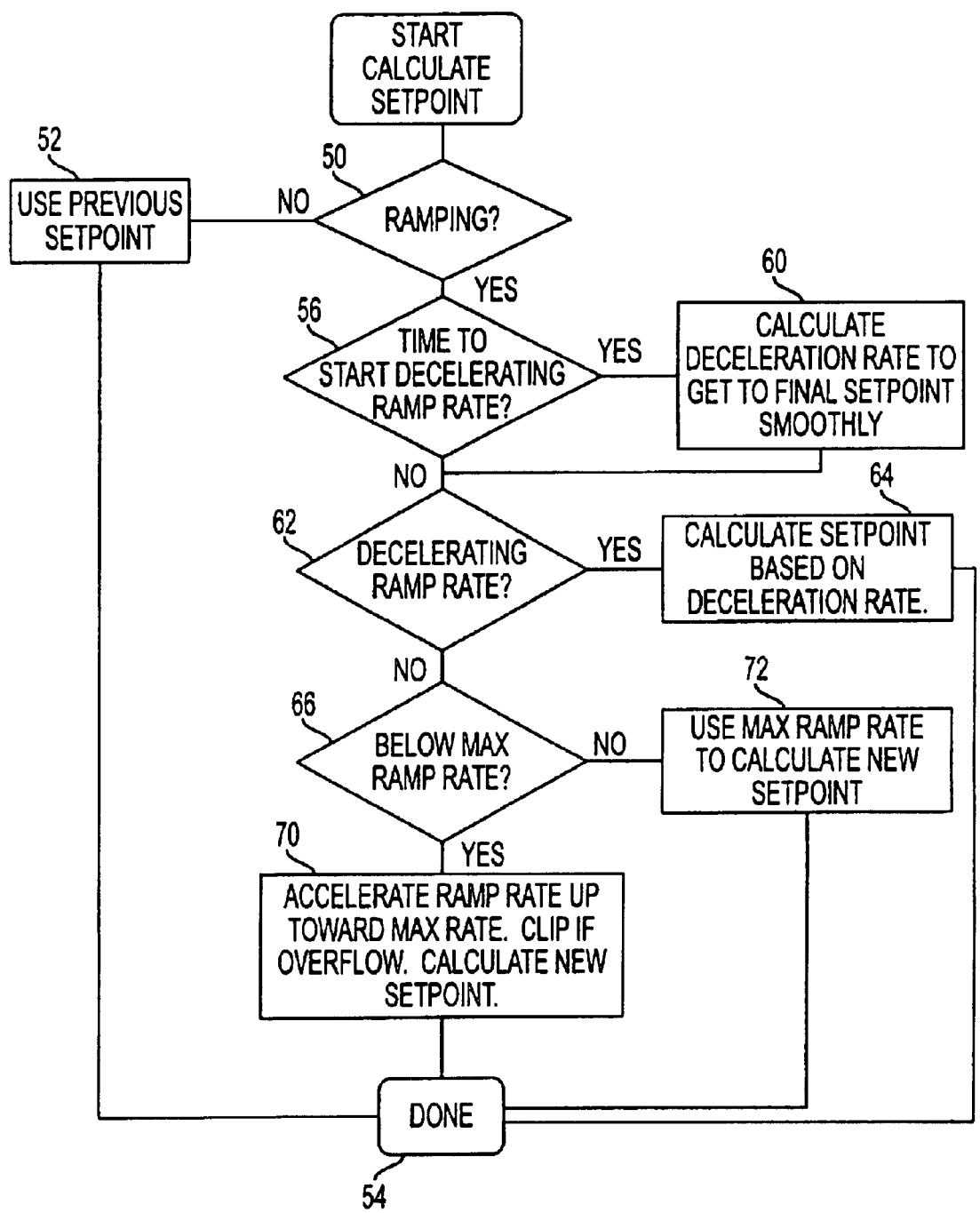
FIG. 6 is a flow chart illustrating one embodiment of the method of the present invention.

FIG. 6 shows a flow chart of one embodiment of the present invention. It is a detailed description of the logic contained in the calculate set point function 42 for calculating the intermediate set point 44. This flow chart describes the logic used to smoothly change the set point 44 from one temperature to another. This is done by first checking whether the body 20 is currently being heated or cooled 50. If not, there is no need to ramp, so the program maintains the current setpoint 52 and exits 54. If a temperature ramp is currently underway, the program checks whether it is time to begin decelerating 56. If decelerating is warranted, a deceleration rate is calculated 60 to smoothly transition the intermediate set point to the ending set point. If the program is currently decelerating the ramp rate 62, a revised temperature setpoint 44 is calculated based on the current deceleration rate 64. If the ramp rate is neither decelerating nor in need of deceleration, then the program verifies whether the ramp rate is currently below the maximum ramp rate 66. For ramp rates below the maximum under these conditions, the program directs an acceleration towards the maximum ramp rate 70. If the ramp rate is currently at the maximum, the program maintains the maximum ramp rate 72 until it reaches the point where it needs to decelerate to smoothly arrive at the final set point.

Experimental

Several experiments were performed in which sensarray semiconductor wafers were heated in an simulated oxidation process in a vertical rapid heating furnace to compare the method of the present invention with prior art temperature control methods. The examples set forth below are provided for illustrative purposes only, and are not intended to limit the present invention in any way.

Figure 7:
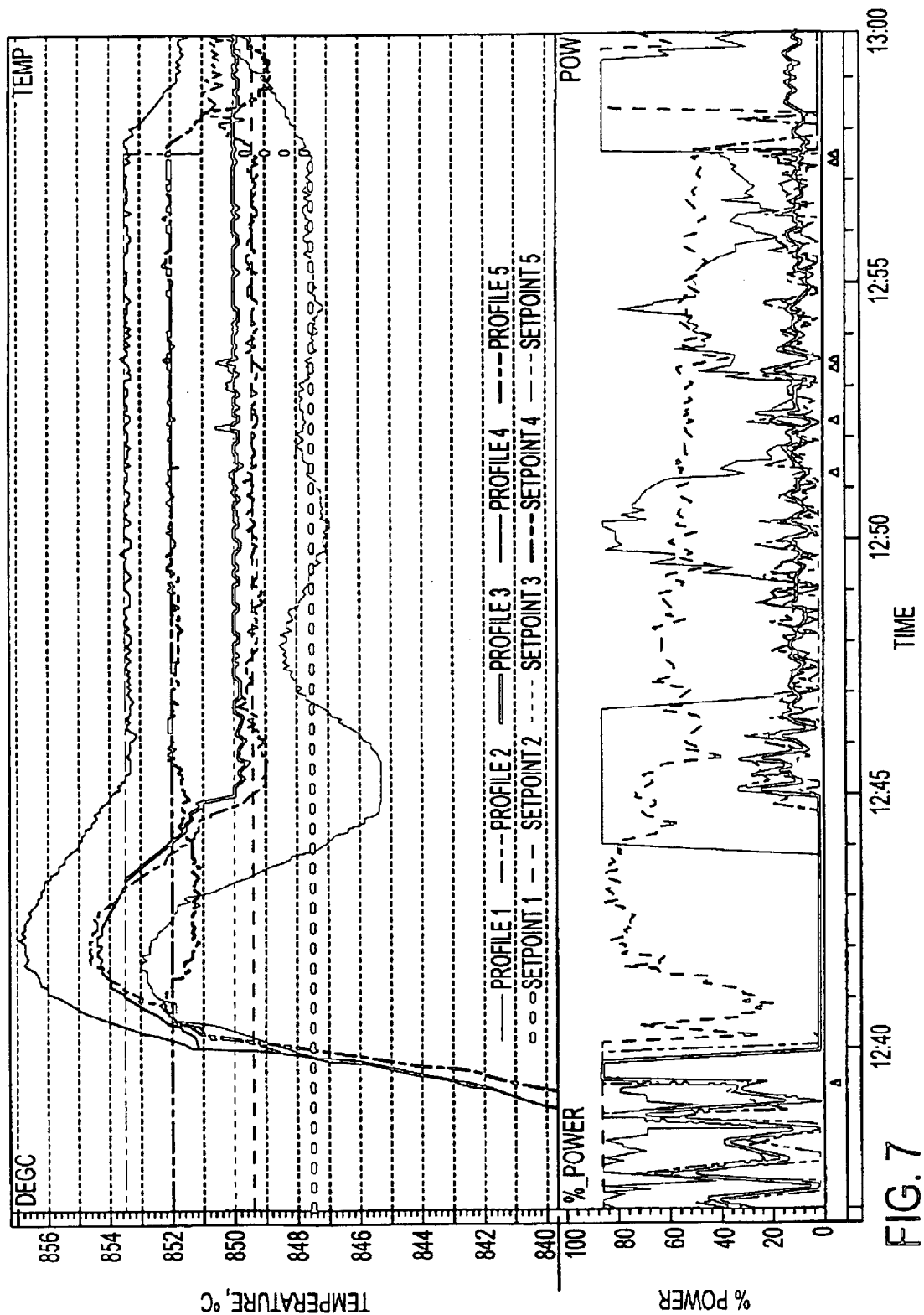
FIG. 7 is a graph showing temperature and applied power data over time for a prior art temperature control method.

To establish a baseline for comparison of the method of the present invention with the prior art, experiments were performed in which the wafers were heated to 850° C. with five heater element zones in a furnace controlled by a PID algorithm without the inertial temperature control system of the present invention. FIG. 7 shows the temperature vs. time (top panel) and applied heater power vs. time response for the five furnace heater element zones. As FIG. 7 shows, with conventional PID control temperature recovery after a temperature ramp occurs with approximately 3 to 4° C. of ending temperature over shoot and an approximately 10 minute recovery time during which the temperatures of the various furnace zones oscillate about the desired temperature and the applied power spikes and shuts off repeatedly.

Figure 8:
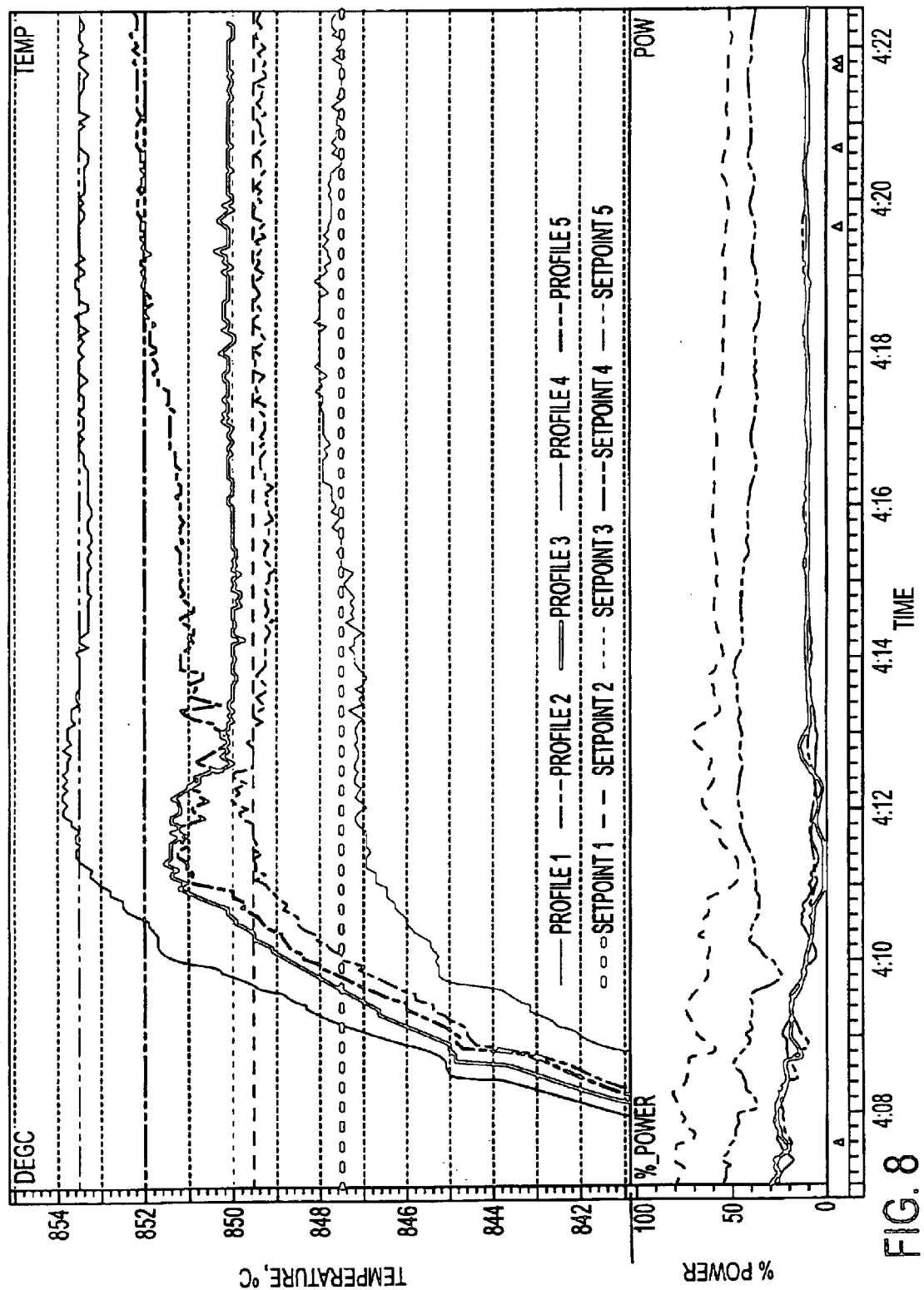
FIG. 8 is a graph showing temperature and applied power data over time provided by the inertial temperature control method and system of the present invention.

A similar test was performed using the same furnace and PID temperature control algorithm augmented with the inertial temperature control method of the present invention. All of the original step times, temperature, and gas flows from the PID-only test were maintained. Only the use of inertial temperature control as provided in the current invention was changed. As shown in FIG. 8, inertial temperature control reduces both the thermal overshoot and the stabilization time. The thermal overshoot is limited to less than 0.5° C. for all zones and the temperature recovery occurs in less than 5 minutes. Additionally the previously mentioned improvements in power regulation are seen when comparing the two data plots. Using the method of the current invention, the power fluctuations are damped both in amplitude and frequency and overall significantly reduced for the same thermal cycle. This has several positive impacts on furnace operation. Due to the reduced cycling of the power an improvement in element life can be expected, additionally there will be less stress on the mechanical assemblies that are in proximity to the furnaces coils, and this should improve overall furnace reliability.

The foregoing description of specific embodiments and examples of the invention have been presented for the purpose of illustration and description, and although the invention has been illustrated by certain of the preceding examples, it is not to be construed as being limited thereby. They are not intended to be exhaustive or to limit the invention to the precise forms disclosed, and obviously many modifications, embodiments, and variations are possible in light of the above teaching. It is intended that the scope of the invention encompass the generic area as herein disclosed, and by the claims appended hereto and their equivalents.

What is claimed is:

1. A method of changing the temperature of a body housed in a heating chamber in a temperature controlled furnace from a starting to an ending set point temperature using a temperature control algorithm characterized in that:

said heating chamber houses one or more controllable heating elements, and one or more temperature sensing devices;

a set point temperature is accelerated from said starting temperature toward said ending temperature at a continuously finite acceleration rate until a defined maximum ramp rate is achieved;

said set point temperature is substantially maintained at said maximum ramp rate until said ending temperature is approached;

said set point temperature is decelerated from said maximum ramp rate at a continuously finite deceleration rate to said ending temperature; and said temperature control algorithm substantially maintains the temperature of said body in conformance to said set point temperature.

2. The method according to claim 1 wherein said controllable heating elements are electrical heating coils.

3. The method according to claim 1 wherein said controllable heating elements are radiant heat lamps.

4. The method according to claim 1 wherein said temperature sensing devices are one or more thermocouples providing one or more temperatures for each of said one or more controllable heating elements.

5. The method according to claim 4 wherein a control temperature which is a mathematical combination of said one or more thermocouple temperatures is an input to said temperature control algorithm.

6. The method according to claim 5 wherein said control temperature is further defined to have a known offset from said thermocouple temperatures.

7. The method according to claim 6 further characterized in that said temperature offsets are static offsets that correct said control temperature for differences between the temperature of said body and said thermocouple temperatures.

8. The method according to claim 1 further characterized in that said body is a semiconductor wafer.

9. A temperature controlled furnace for changing the temperature of a body comprising:
- a heating chamber housing one or more controllable heating elements, and one or more temperature sensing devices; and
- a temperature controller configured to carry out the method of claim 1.

10. A method of changing the temperature of a body housed in a heating chamber in a temperature controlled furnace from a starting to an ending temperature using a temperature control algorithm comprising the steps of:
- providing temperature data from one or more temperature sensing devices in said heating chamber and a temperature set point as inputs to said temperature control algorithm which controls power delivery to one or more controllable heating elements in said furnace;
- accelerating said temperature set point from said starting set point temperature at a continuously finite programmed acceleration rate until a defined maximum temperature ramp rate is achieved;
- maintaining said set point temperature at said maximum temperature ramp rate until said ending temperature is approached; and
- decelerating said temperature set point from said maximum ramp rate at a continuously finite programmed deceleration rate until said ending set point temperature is reached such that the temperature of said body reaches said ending set point temperature smoothly without substantially overshooting or oscillating about said ending set point temperature.

11. The method according to claim 10 wherein said controllable heating elements are electrical heating coils.

12. The method according to claim 10 wherein said controllable heating elements are radiant heat lamps.

13. The method according to claim 10 wherein said temperature sensing devices are one or more thermocouples providing one or more temperatures for each of said one or more controllable heating elements.

14. The method according to claim 13 wherein said one or more temperature data inputs to said temperature control algorithm is a control temperature that is a mathematical combination of said one or more thermocouple temperatures.

15. The method according to claim 14 wherein said control temperature is further defined to have a known offset from said thermocouple temperatures.

16. The method according to claim 15 further characterized in that said temperature offsets are static offsets that correct said control temperature for differences between the temperature of said body and said thermocouple temperatures.

17. The method according to claim 10 further characterized in that said body is a semiconductor wafer.

18. A temperature controlled furnace for changing the temperature of a body comprising:
- a heating chamber housing one or more controllable heating elements, and one or more temperature sensing devices; and
- a temperature controller configured to carry out the method of claim 10.

19. A temperature controlled furnace for changing the temperature of a body comprising:
- a heating chamber housing one or more controllable heating elements, and one or more temperature sensing devices; and
- a temperature controller configured to receive a set point temperature profile and temperature data inputs representative of said temperature sensing devices housed in said heating chamber and configured to vary power delivery to said one or more controllable heating elements such that the temperature of said body is ramped through a temperature acceleration phase wherein the temperature is accelerated at a continuously finite rate, a constant ramp rate phase, and a temperature deceleration phase wherein the temperature is decelerated at a continuously finite rate to achieve a desired temperature substantially smoothly with minimal oscillation around said desired temperature.

20. The furnace according to claim 19 wherein said controllable heating elements are electrical heating coils.

21. The furnace according to claim 19 wherein said controllable heating elements are radiant heat lamps.

22. The furnace according to claim 19 wherein said temperature sensing devices are one or more thermocouples providing one or more temperatures for each of said one or more controllable heating elements.

23. The furnace according to claim 22 wherein said one or more temperature data inputs to said temperature control algorithm is a control temperature that is a mathematical combination of said one or more thermocouple temperatures.

24. The furnace according to claim 23 wherein said control temperature is further defined to have a known offset from said thermocouple temperatures.

25. The furnace according to claim 24 further characterized in that said temperature offsets are static offsets that correct said control temperature for differences between the temperature of said body and said thermocouple temperatures.

26. The furnace according to claim 19 further characterized in that said body is a semiconductor wafer.

* * * * *